United States Patent
Okabe et al.

(10) Patent No.: US 10,840,269 B2
(45) Date of Patent: Nov. 17, 2020

(54) SEMICONDUCTOR DEVICE AND METHOD OF MANUFACTURING SEMICONDUCTOR DEVICE

(71) Applicant: Sharp Kabushiki Kaisha, Sakai (JP)

(72) Inventors: Tohru Okabe, Sakai (JP); Tetsunori Tanaka, Sakai (JP); Takeshi Yaneda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 42 days.

(21) Appl. No.: 16/066,696

(22) PCT Filed: Mar. 29, 2017

(86) PCT No.: PCT/JP2017/012839
§ 371 (c)(1),
(2) Date: Jun. 28, 2018

(87) PCT Pub. No.: WO2018/179121
PCT Pub. Date: Oct. 4, 2018

(65) Prior Publication Data
US 2019/0363102 A1  Nov. 28, 2019

(51) Int. Cl.
*H01L 27/12* (2006.01)
*H01L 29/417* (2006.01)
*H01L 29/786* (2006.01)

(52) U.S. Cl.
CPC ........ *H01L 27/124* (2013.01); *H01L 27/1251* (2013.01); *H01L 29/41733* (2013.01); *H01L 29/78678* (2013.01)

(58) Field of Classification Search
CPC ............. H01L 27/1251; H01L 27/1222; H01L 27/124; H01L 27/1248; H01L 27/3258;
(Continued)

(56) References Cited

U.S. PATENT DOCUMENTS

2010/0110320 A1*  5/2010  Kitakado .......... G02F 1/136286
349/39
2010/0182223 A1  7/2010  Choi et al.
(Continued)

FOREIGN PATENT DOCUMENTS

JP  2011-192979 A  9/2011
JP  2013-145878 A  7/2013
(Continued)

OTHER PUBLICATIONS http://en.wikipedia.org/wiki/Threshold_Voltage (Year: 2013).*
(Continued)

*Primary Examiner* — Eric A. Ward
*Assistant Examiner* — Eric K Ashbahian
(74) *Attorney, Agent, or Firm* — Keating & Bennett, LLP

(57) ABSTRACT

A semiconductor device provided in a pixel circuit of a display device includes, in order from a lower side: a substrate; an LTPS layer; a first gate insulating layer; a first metal layer; a first flattened layer; a second gate insulating layer; an oxide semiconductor layer; a second metal layer; a passivation layer; and a third metal layer. The gate electrode layer of an LTPS-TFT and the gate electrode of an oxide semiconductor TFT are formed by the first metal layer.

7 Claims, 11 Drawing Sheets

(58) Field of Classification Search
CPC ... H01L 27/1214–1296; H01L 27/3241–3297;
H01L 29/78696; H01L 29/41733; H01L
29/78678; G02F 2001/136231; G02F
2001/136236; G02F 2001/136245; G02F
2001/136281; G02F 2001/13629; G02F
2001/136295; G02F 2001/13685
See application file for complete search history.

(56) References Cited

U.S. PATENT DOCUMENTS

| | | | |
|---|---|---|---|
| 2011/0062432 A1* | 3/2011 | Yamazaki | H01L 29/7869 257/43 |
| 2011/0140099 A1* | 6/2011 | Yamazaki | H01L 27/0688 257/43 |
| 2011/0204365 A1 | 8/2011 | Saito | |
| 2013/0153890 A1 | 6/2013 | Yoneda | |
| 2013/0214279 A1 | 8/2013 | Nishimura et al. | |
| 2013/0240886 A1 | 9/2013 | Yeh et al. | |
| 2014/0131703 A1 | 5/2014 | Miyamoto et al. | |
| 2015/0055051 A1* | 2/2015 | Osawa | H01L 27/1225 349/48 |
| 2016/0126241 A1* | 5/2016 | Ellinger | H01L 27/0883 257/43 |
| 2016/0247831 A1 | 8/2016 | Makita et al. | |
| 2016/0372497 A1* | 12/2016 | Lee | H01L 27/1255 |
| 2017/0338249 A1* | 11/2017 | Suzumura | H01L 29/41733 |
| 2018/0033849 A1* | 2/2018 | Noh | H01L 27/3272 |
| 2018/0076102 A1* | 3/2018 | Ka | H01L 29/41733 |

FOREIGN PATENT DOCUMENTS

| | | |
|---|---|---|
| JP | 2016-534390 A | 11/2016 |
| WO | 2011/135908 A1 | 11/2011 |
| WO | 2012/176422 A1 | 12/2012 |
| WO | 2015/052991 A1 | 4/2015 |

OTHER PUBLICATIONS https://en.wikipedia.org/wiki/Threshold_voltage (Year: 2015).*
Official Communication issued in International Patent Application No. PCT/JP2017/012839, dated Jun. 20, 2017.

* cited by examiner

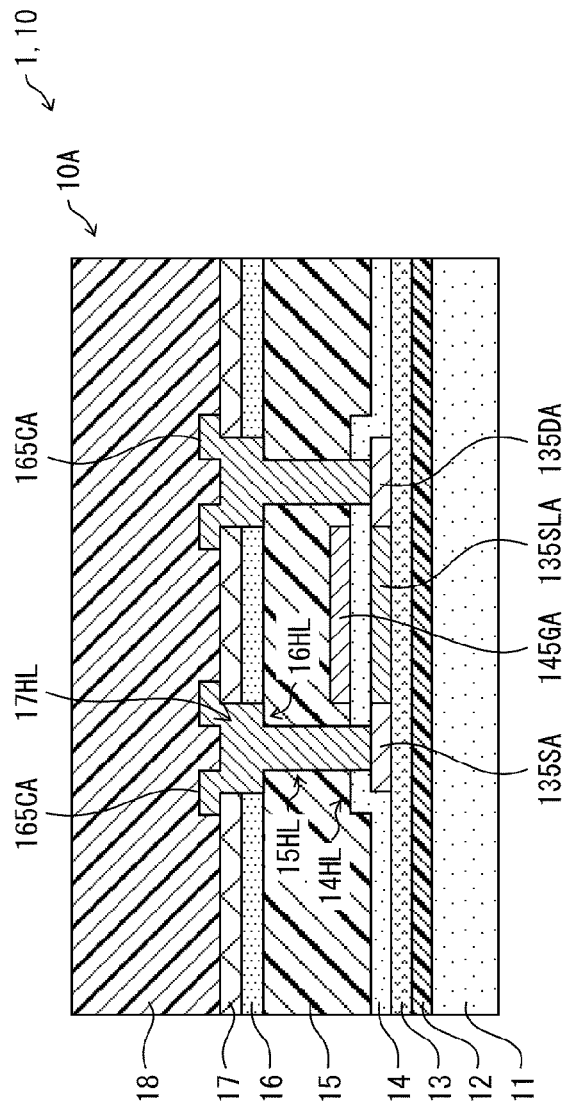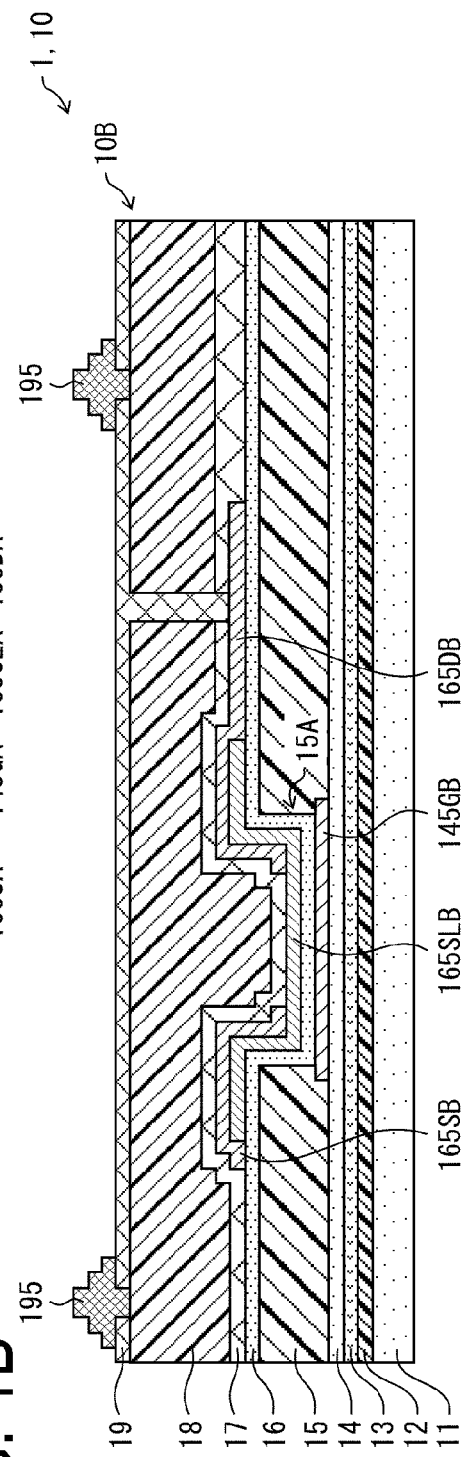

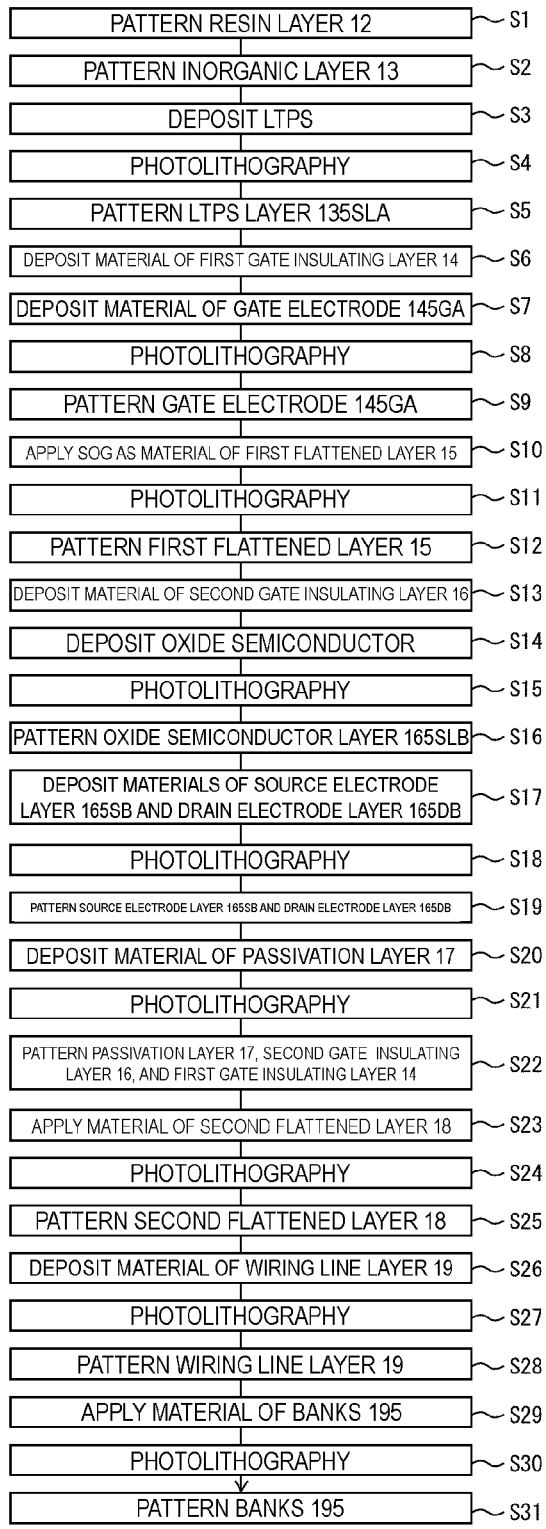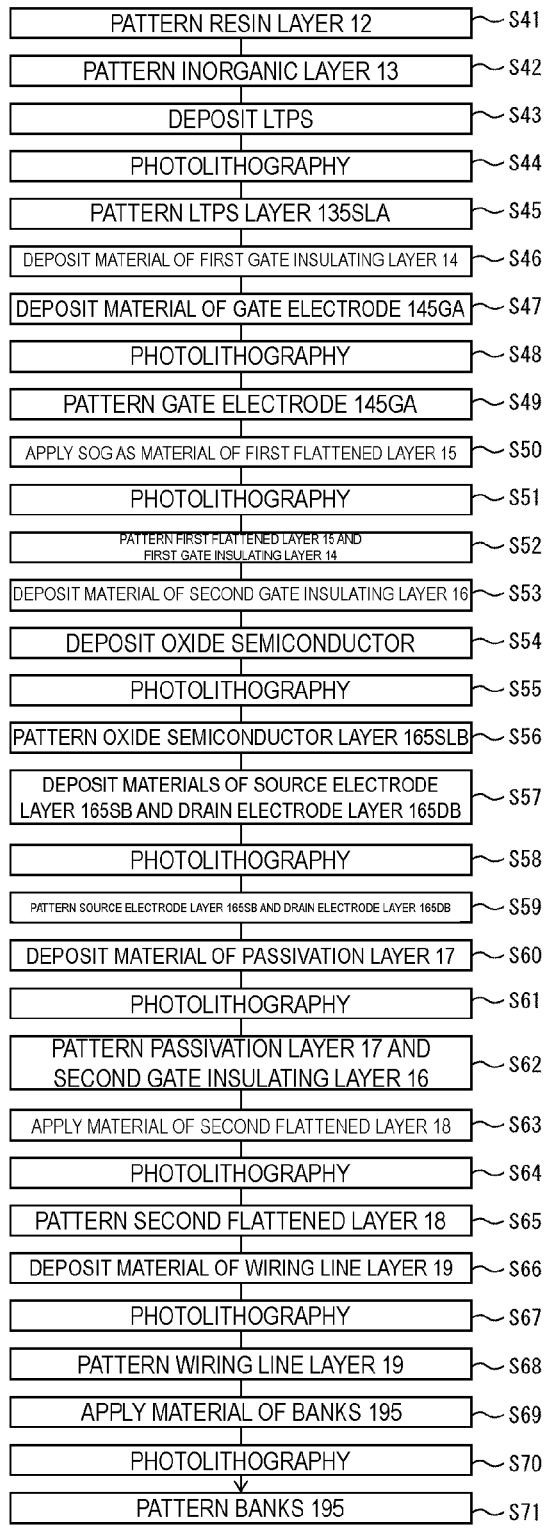

US 10,840,269 B2

SEMICONDUCTOR DEVICE AND METHOD OF MANUFACTURING SEMICONDUCTOR DEVICE

TECHNICAL FIELD

The disclosure relates to a semiconductor device provided in a pixel circuit of a display device.

BACKGROUND ART

In recent years, Thin Film Transistors (TFTs) have been used broadly in electronic devices such as display devices. PTL 1 discloses a display device in which (i) a TFT using Low-Temperature PolySilicon (LTPS) as a semiconductor material and (ii) a TFT using an oxide semiconductor as a semiconductor material are provided.

CITATION LIST

Patent Literature

PTL 1: JP 2016-534390 A (published Nov. 4, 2016)

SUMMARY

Technical Problem

In a semiconductor device such as that described above, capacitive coupling not intended by design arises between a gate electrode layer and other electrode layers (a source electrode layer in particular) in each TFT, as will be described below. Noise arises as a result of this capacitive coupling, which may reduce the reliability of the operations of the semiconductor device.

Solution to Problem

To solve the above-described problem, a semiconductor device according to one aspect of the disclosure is a semiconductor device provided in a pixel circuit of a display device, the semiconductor device including, in order from a lower side: a substrate; a semiconductor layer of a first transistor; a first insulating layer; a first metal layer; a first flattened layer; a second insulating layer; a semiconductor layer of a second transistor; a second metal layer; a third insulating layer; and a third metal layer. The first transistor includes low-temperature polysilicon as a semiconductor material; the second transistor includes an oxide semiconductor as a semiconductor material; and a gate electrode of the first transistor and a gate electrode of the second transistor are formed by the first metal layer.

Additionally, to solve the above-described problems, a method of manufacturing a semiconductor device according to one aspect of the disclosure is a method of manufacturing a semiconductor device provided in a pixel circuit of a display device, the semiconductor device including, in order from a lower side: a substrate; a semiconductor layer of a first transistor; a first insulating layer; a first metal layer; a first flattened layer; a second insulating layer; a semiconductor layer of a second transistor; a second metal layer; a third insulating layer; and a third metal layer. The first transistor includes low-temperature polysilicon as a semiconductor material; and the second transistor includes an oxide semiconductor as a semiconductor material. The method includes forming a gate electrode of the first transistor and a gate electrode of the second transistor by the first metal layer.

Advantageous Effects of Invention

A semiconductor device according to an aspect of the disclosure can improve the reliability of the operations of the semiconductor device.

The same effects are achieved by a method of manufacturing a semiconductor device according to an aspect of the disclosure.

BRIEF DESCRIPTION OF DRAWINGS

FIGS. 1A and 1B are diagrams illustrating the overall configuration of a semiconductor device according to a first embodiment, where FIG. 1A is a diagram illustrating the configuration of an LTPS-TFT and FIG. 1B is a diagram illustrating the configuration of an oxide semiconductor TFT.

FIGS. 2A and 2B are diagrams illustrating the flow of a process for manufacturing the semiconductor device illustrated in FIGS. 1A and 1B.

DESCRIPTION OF EMBODIMENTS

First Embodiment

Figure 3:
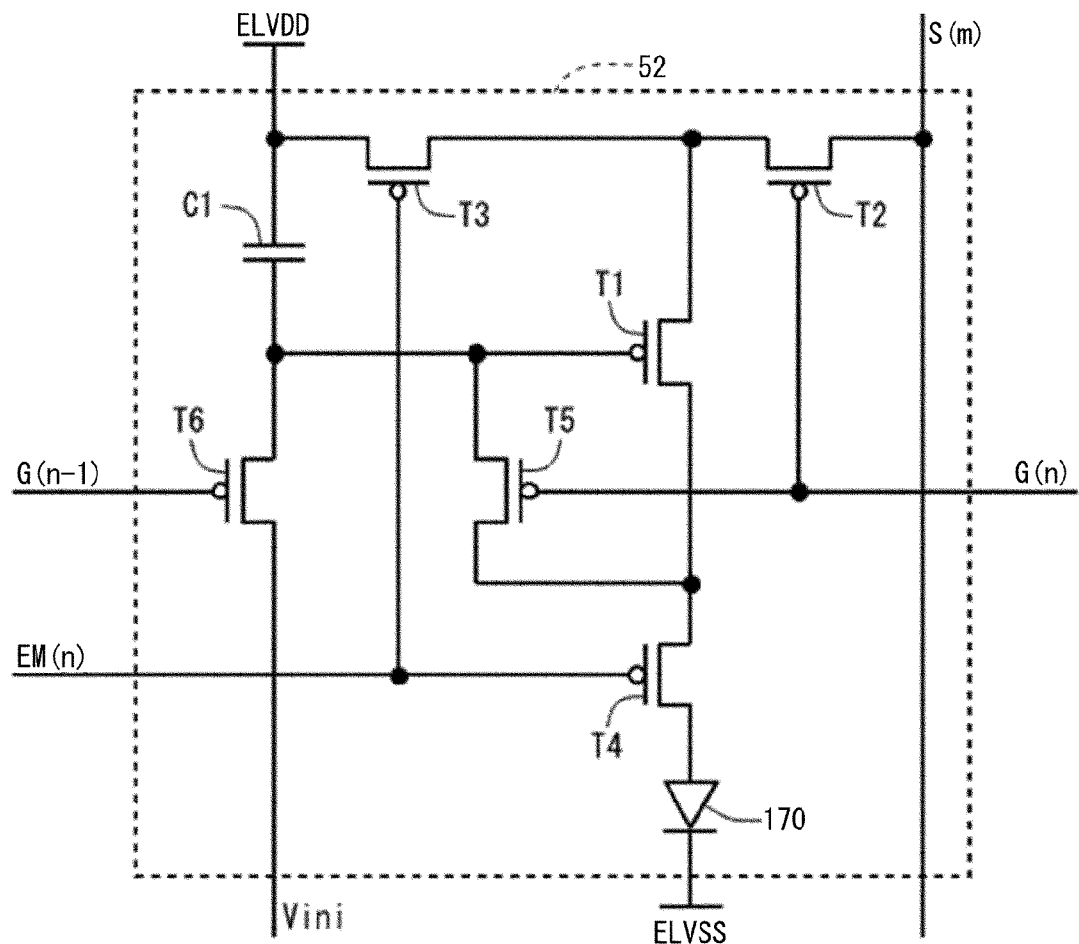
FIG. 3 is a diagram illustrating an example of a pixel circuit provided in a display device illustrated in FIGS. 1A and 1B.

A first embodiment of the disclosure will be described hereinafter on the basis of FIGS. 1 to 3. Various members of a semiconductor device 10 according to the first embodiment are illustrated in the drawings referred to hereinafter, and members unrelated to the first embodiment will not be described. The members not described may be understood as being similar to known members. Note that the drawings are intended to provide general illustrations of the shapes, structures, and positional relationships of the members, and are not necessary drawn to scale.

Overview of Semiconductor Device 10

FIGS. 1A and 1B are diagrams illustrating the overall configuration of the semiconductor device 10. The semiconductor device 10 may be provided in a pixel circuit 52 (see FIG. 3, described later) configured to drive a pixel in a display device 1. The display device 1 may be an Electro Luminescence (EL) display, for example.

The semiconductor device 10 can be used as an active matrix substrate of the display device 1, for example. The display device 1 is not particularly limited to a specific device as long as it is a display panel including optical elements (light emitting elements 170). The optical elements may be optical elements in which a luminance or transmittance is controlled by current, or optical elements in which the luminance or transmittance is controlled by voltage.

An Organic Light Emitting Diode (OLED), an inorganic light emitting diode, and a Quantum dot Light Emitting Diode (QLED) can be given as examples of current-controlled light emitting elements.

As such, the display device 1 may be an organic Electro Luminescence (EL) display including OLEDs or an inorganic EL display including inorganic light emitting diodes. In other words, the display device 1 may be a known type of EL display. Alternatively, the display device 1 may be a QLED display including QLEDs. Liquid crystal display elements and the like can be given as examples of voltage-controlled optical elements.

The semiconductor device 10 includes a TFT containing LTPS as a semiconductor material and a TFT containing an oxide semiconductor (e.g., an InGaZnOx-based metal oxide) as a semiconductor material. The TFT containing LTPS as a material will be called an LTPS-TFT 10A (first transistor). The TFT containing an oxide semiconductor as a material will be called an oxide semiconductor TFT 10B (second transistor).

For the sake of simplicity, a direction facing a gate electrode layer 145GA and a gate electrode layer 145GB from a substrate 11 will also be referred to as the "upward direction". The direction opposite to the upward direction will be referred to as the "downward direction".

The gate electrode layers 145GA and 145GB illustrated in FIGS. 1A and 1B may also be referred to collectively as a "first metal layer". A source electrode layer 135SA and a drain electrode layer 135DA may also be referred to collectively as a "second metal layer". An electrode layer 165CA may be referred to as a "third metal layer". A wiring line layer 19 may be referred to as a "fourth metal layer". The first metal layer to the fourth metal layer are provided in that order from the bottom as viewed from the substrate 11.

In FIGS. 1A and 1B, FIG. 1A is a diagram illustrating the configuration of the LTPS-TFT 10A, and FIG. 1B is a diagram illustrating the configuration of the oxide semiconductor TFT 10B. A plurality of both LTPS-TFTs 10A and oxide semiconductor TFTs 10B may be formed on the substrate 11. The semiconductor device 10 may be an active matrix-type device.

The substrate 11 supports the members of the LTPS-TFT 10A and the oxide semiconductor TFT 10B. LTPS is a semiconductor material having high mobility, and thus the LTPS-TFT 10A can be used as a switching TFT (switching element) having excellent response. The LTPS-TFT 10A is favorably used in the pixel circuit 52 as a switching TFT.

The LTPS-TFT 10A is used as a switching TFT that switches a connection state of the pixel circuit 52 in the display device 1. To be more specific, the LTPS-TFT 10A switches a connection state between the pixel circuit 52 in the display device 1 and a data line S(n), scanning signal lines G(n−1) and G(n), and a light emission control line EM(n) of the display device 1 (see FIG. 3, described later).

Specifically, the LTPS-TFT 10A may be used as transistors T2 to T6 in the pixel circuit 52. Because LTPS is used as a semiconductor material, the LTPS-TFT 10A may be formed as an n-channel TFT or as a p-channel TFT.

The oxide semiconductor TFT 10B is a TFT capable of having greatly reduced leak current, and thus can be used favorably as a driving TFT (driving transistor) in the pixel circuit 52. Specifically, the oxide semiconductor TFT 10B may be used as a transistor T1 (driving TFT) in the pixel circuit 52.

A "driving TFT" is a TFT for driving (controlling the lighting of) the light emitting element 170 provided in the pixel circuit 52. As illustrated in FIG. 3, the transistor T1 (oxide semiconductor TFT 10B) is connected to an anode of the light emitting element 170 with the transistor T4 therebetween.

The oxide semiconductor TFT 10B may be used as a switching TFT. Accordingly, at least some of one or more oxide semiconductor TFTs 10B may be used as driving TFTs.

Because an oxide semiconductor is used as the semiconductor material, the oxide semiconductor TFT 10B is formed as an n-channel TFT.

LTPS-TFT 10A

The configuration of the LTPS-TFT 10A will be described with reference to FIG. 1A. In the LTPS-TFT 10A, a face (upper face) of the substrate 11 is covered by a resin layer 12. The material of the resin layer 12 is polyimide (PI), for example. The face of the resin layer 12 is covered by an inorganic layer 13. The inorganic layer 13 serves as a barrier layer.

(i) An LTPS layer 135SLA (semiconductor layer), and (ii) the source electrode layer 135SA and the drain electrode layer 135DA, serving as an electrically conductive layer (electrode layer), are formed on parts of the face of the inorganic layer 13. The LTPS layer 135SLA is arranged between the source electrode layer 135SA and the drain electrode layer 135DA on the face of the inorganic layer 13.

A first gate insulating layer 14 (first insulating layer) is formed covering the inorganic layer 13, the LTPS layer 135SLA, the source electrode layer 135SA, and the drain electrode layer 135DA. The gate electrode layer 145GA is formed on part of the face of the first gate insulating layer 14.

Thus, in the LTPS-TFT 10A, the gate electrode layer 145GA is provided above the LTPS layer 135SLA. In other words, the LTPS-TFT 10A is configured as a top gate-type TFT.

A first flattened layer 15 is formed covering the first gate insulating layer 14 and the gate electrode layer 145GA (first metal layer). The material of the first flattened layer 15 is a Spin on Glass (SOG) material. In other words, the first flattened layer 15 contains a SOG material as its primary component. The first flattened layer 15 is formed as a layer that is much thicker than the other layers, aside from a second flattened layer 18, which will be described later.

A known organic SOG material or inorganic SOG material, for example, may be used as the material of the first flattened layer 15. However, an organic SOG material is preferred to an inorganic SOG material as the material of the first flattened layer 15 from the standpoint of making the first flattened layer 15 thicker.

A second gate insulating layer 16 (second insulating layer) is formed covering the first flattened layer 15. A passivation layer 17 (third insulating layer) is formed covering the second gate insulating layer 16. The passivation layer 17 also functions as an insulating layer. The first gate insulating layer 14, the second gate insulating layer 16, and the passivation layer 17 may be formed from a known inorganic material.

Examples of the inorganic material include silicon nitride, silicon oxide, and silicon oxynitride. The first gate insulating layer 14, the second gate insulating layer 16, and the passivation layer 17 may be configured as layered films of the inorganic material, formed through CVD.

Two of the electrode layers 165CA (third metal layer) are formed on parts of the face of the passivation layer 17. The source electrode layer 135SA and the drain electrode layer 135DA are electrically connected to corresponding ones of the two electrode layers 165CA with contact holes therebetween (and more specifically, wiring lines formed in those contact holes). The contact holes are formed passing through the first gate insulating layer 14, the first flattened layer 15, the second gate insulating layer 16, and the passivation layer 17.

Specifically, the contact holes include a contact hole 14HL formed in the first gate insulating layer 14, a contact hole 15HL formed in the first flattened layer 15, a contact hole 16HL formed in the second gate insulating layer 16, and a contact hole 17HL formed in the passivation layer 17. The aforementioned wiring lines are formed by filling the contact holes with the same material as that of the electrode layers 165CA.

Note that the contact hole 14HL and the contact hole 15HL may be patterned simultaneously. In this case, the contact hole 15HL functions as a mask for the contact hole 14HL. Thus, as illustrated in FIG. 1A, the contact hole 14HL and the contact hole 15HL can be formed so that the circumferential ends thereof coincide (are flush) when viewed in the normal direction of the substrate 11 (a direction perpendicular to the substrate 11).

Additionally, the contact hole 16HL and the contact hole 17HL may be patterned simultaneously. In this case, the contact hole 16HL and the contact hole 17HL are patterned using the same photopattern. Thus, as illustrated in FIG. 1A, the contact hole 16HL and the contact hole 17HL can be formed so that the circumferential ends thereof coincide when viewed in the normal direction of the substrate 11.

Furthermore, the contact hole 16HL and the contact hole 17HL are formed so that the openings therein are wider than the openings in the contact hole 14HL and the contact hole 15HL, respectively. With respect to the contact holes, the opening being "wider" specifically means that the opening "has a greater area" when viewed in the direction perpendicular to the substrate 11.

In a case where a contact hole has a circular cross-section when viewed in the direction perpendicular to the substrate 11, a contact hole having a "wider opening" can be formed by increasing the diameter of the opening.

However, in a case where the contact hole has a rectangular cross-section when viewed in the direction perpendicular to the substrate 11, a contact hole having a "wider opening" can be formed by lengthening the long sides or the short sides of the rectangle (e.g., the length in the horizontal direction in FIGS. 1A and 1B).

The second flattened layer 18 is formed covering the passivation layer 17 and the electrode layers 165CA. The second flattened layer 18 is formed as a layer that is much thicker than the other layers, aside from the first flattened layer 15. Although the material of the second flattened layer 18 may be a known material, an organic material is preferably used as the material of the second flattened layer 18 from the standpoint of making the second flattened layer 18 thicker.

Oxide Semiconductor TFT 10B

The configuration of the oxide semiconductor TFT 10B will be described next with reference to FIG. 1B. Like the LTPS-TFT 10A, in the oxide semiconductor TFT 10B, the resin layer 12, the inorganic layer 13, the first gate insulating layer 14, the first flattened layer 15, the second gate insulating layer 16, the passivation layer 17, and the second flattened layer 18 are provided in that order on the substrate 11.

The oxide semiconductor TFT 10B includes the gate electrode layer 145GB formed on part of the face of the first gate insulating layer 14. Thus, the semiconductor device 10 includes the gate electrode layer 145GA of the LTPS-TFT 10A and the gate electrode layer 145GB of the oxide semiconductor TFT 10B disposed on the same layer (i.e., on the first gate insulating layer 14). To be more specific, the gate electrode layers 145GA and 145GB are formed as the first metal layer (the metal layer closest to the substrate 11). With such an arrangement, the gate electrode layer 145GA and the gate electrode layer 145GB can be provided as a common gate electrode (common gate).

In the oxide semiconductor TFT 10B, part of the gate electrode layer 145GB is not covered by the first flattened layer 15. In other words, an opening 15A (recessed portion) is formed in part of the first flattened layer 15. The opening 15A may be formed to expose the gate electrode layer 145GB (first metal layer) to the greatest extent possible. "Forming the opening 15A to expose the gate electrode layer 145GB (first metal layer) to the greatest extent possible" means that the opening 15A is present over the entire surface of the gate electrode layer 145GB. The opening 15A is partially filled with the second gate insulating layer 16. Thus, the second gate insulating layer 16 is partially formed in a position corresponding to the opening 15A. Therefore, like the first flattened layer 15, the second gate insulating layer 16 includes a recessed portion. The gate electrode layer 145GB exposed by the opening 15A is covered by the second gate insulating layer 16.

An oxide semiconductor layer 165SLB (semiconductor layer) is formed on the face of the recessed portion in the second gate insulating layer 16. Thus, the second gate insulating layer 16 and the oxide semiconductor layer 165SLB are formed on an upper side in the opening 15A. More specifically, the second gate insulating layer 16 and the oxide semiconductor layer 165SLB are formed at least partially overlapping the opening 15A when viewed in the normal direction of the second gate insulating layer 16 and the oxide semiconductor layer 165SLB.

A source electrode layer 165SB and a drain electrode layer 165DB (second metal layer) are formed as electrically conductive layers (electrode layers) on part of the face of the oxide semiconductor layer 165SLB. The oxide semiconductor layer 165SLB, the source electrode layer 165SB, and the drain electrode layer 165DB are also partially formed in parts of the opening 15A.

Thus, the oxide semiconductor TFT 10B includes the gate electrode layer 145GB provided below the oxide semiconductor layer 165SLB. In other words, the oxide semiconductor TFT 10B is configured as a bottom gate-type TFT. The oxide semiconductor layer 165SLB is therefore provided at a higher position than a position of the LTPS-TFT 10A.

The passivation layer 17 is formed covering the second gate insulating layer 16, the oxide semiconductor layer 165SLB, the source electrode layer 165SB, and the drain electrode layer 165DB. The second flattened layer 18 is formed covering the passivation layer 17.

The oxide semiconductor TFT 10B includes the wiring line layer 19 formed on the face of the second flattened layer 18. The wiring line layer 19 is a wiring line layer for electrically connecting the oxide semiconductor TFT 10B to an external element. An electrically conductive material having excellent optical transparency, such as Indium Tin Oxide (ITO), may be used as the material of the wiring line layer 19.

The wiring line layer 19 (fourth metal layer) is connected to the drain electrode layer 165DB with a contact hole (and more specifically, a wiring line formed in the contact hole) therebetween. The contact hole is formed passing through the passivation layer 17 and the second flattened layer 18. The aforementioned wiring line is formed by filling the contact hole with the same material as that of the wiring line layer 19.

As one example, the wiring line layer 19 may be a wiring line layer for connecting the drain electrode layer 165DB of the oxide semiconductor TFT 10B to the anode of the aforementioned light emitting element 170. According to this configuration, the oxide semiconductor TFT 10B can be used as a driving TFT in the pixel circuit.

Two banks 195 are formed on the face of the wiring line layer 19. The banks 195 are partitions for separating areas corresponding to individual pixels (individual pixel areas).

Example of Method of Manufacturing Semiconductor Device 10

FIG. 2A is a flowchart illustrating an example of steps S1 to S31 of a process for manufacturing the semiconductor device 10.

First, the material of the resin layer 12 is applied to the face of the substrate 11 and that material is cured to pattern the resin layer 12 (S1). Next, the material of the inorganic layer 13 is deposited on the face of the resin layer 12 to pattern the inorganic layer 13 (S2).

Next, LTPS is deposited on the face of the inorganic layer 13 (S3) and the deposited LTPS is subjected to a photolithography process (S4) to pattern the LTPS layer 135SLA (S5).

After S5, the material of the source electrode layer 135SA and the drain electrode layer 135DA is deposited on the face of the inorganic layer 13 and that material is subjected to a photolithography process to pattern the source electrode layer 135SA and the drain electrode layer 135DA.

Next, the material of the first gate insulating layer 14 is deposited on the faces of the inorganic layer 13, the LTPS layer 135SLA, the source electrode layer 135SA, and the drain electrode layer 135DA (S6). The material of the gate electrode layer 145GA is then deposited on the face of the first gate insulating layer 14 (S7). The material of the gate electrode layer 145GA is subjected to a photolithography process (S8) to pattern the gate electrode layer 145GA (S9). The gate electrode layer 145GB is patterned in the same manner as the gate electrode layer 145GA.

A SOG material, which is the material of the first flattened layer 15, is applied to the face of the first gate insulating layer 14 and the gate electrode layer 145GB (gate electrode layer 145GA) (S10). The applied SOG material is subjected to a photolithography process (S11) to pattern the first flattened layer 15 (S12). Specifically, the first flattened layer 15 is patterned to provide the above-described opening 15A.

In a case where the SOG material is photosensitive, the photolithography process of S11 may be only a developing process. This is because in a case where the SOG material is photosensitive, the first flattened layer 15 can be patterned through the developing process alone.

Next, the material of the second gate insulating layer 16 is deposited on the face of the first flattened layer 15 (S13). As a result, a recessed portion corresponding to the opening 15A in the first flattened layer 15 is provided in the second gate insulating layer 16. Then, the material of the oxide semiconductor layer 165SLB is deposited in the recessed portion in the second gate insulating layer 16 (S14) and the deposited material is subjected to a photolithography process (S15) to pattern the oxide semiconductor layer 165SLB (S16).

Next, the material of the source electrode layer 165SB and the drain electrode layer 165DB is deposited on the faces of the second gate insulating layer 16 and the oxide semiconductor layer 165SLB (S17) and the deposited material is subjected to a photolithography process (S18) to pattern the source electrode layer 165SB and the drain electrode layer 165DB (S19).

Next, the passivation layer 17 is deposited on the faces of the second gate insulating layer 16, the source electrode layer 165SB, the oxide semiconductor layer 165SLB, and the drain electrode layer 165DB (S20). Then, the passivation layer 17, the second gate insulating layer 16, and the first gate insulating layer 14 are subjected to a photolithography process (S21) to pattern the passivation layer 17, the second gate insulating layer 16, and the first gate insulating layer 14 (S22).

As one example, in S22, the passivation layer 17, the second gate insulating layer 16, and the first gate insulating layer 14 are patterned through dry etching. In this case, the circumferential ends of the contact hole 17HL provided in the passivation layer 17, the contact hole 16HL formed in the second gate insulating layer 16, and the contact hole 14HL provided in the first gate insulating layer 14 coincide.

In a case where the contact hole 15HL is within the contact hole 16HL when viewed from a direction perpendicular to the substrate 11, the contact hole 15HL functions as a mask for the contact hole 14HL. The circumferential ends of the contact hole 15HL and the contact hole 14HL therefore coincide.

Note that in a case where the first gate insulating layer 14 have been patterned at the same time as the first flattened layer 15, the first gate insulating layer 14 need not be patterned in S22 (see FIG. 2B, described later).

In this case, the circumferential ends of the contact hole 17HL provided in the passivation layer 17 and the contact hole 16HL provided in the second gate insulating layer 16 coincide. The circumferential ends of the contact hole 14HL provided in the first gate insulating layer 14 and the contact hole 15HL provided in the first flattened layer 15 coincide. Furthermore, the contact hole 17HL has a wider opening than that of the contact hole 14HL (see FIG. 1A as well).

Additionally, after S22, the electrode layers 165CA are patterned and the electrode layers 165CA are connected to the source electrode layer 135SA and the drain electrode layer 135DA, respectively.

Next, the material of the second flattened layer 18 is applied to the faces of the passivation layer 17 and the electrode layers 165CA (S23) and the applied material is subjected to a photolithography process (S24) to pattern the second flattened layer 18 (S25).

Then, the material of the wiring line layer 19 is deposited on the face of the second flattened layer 18 (S26) and the deposited material is subjected to a photolithography process (S27) to pattern the wiring line layer 19 (S29). As described above, the wiring line layer 19 may be patterned so as to be connected to the drain electrode layer 165DB.

Next, the material of the banks 195 is deposited onto the face of the wiring line layer 19 (S29) and the deposited material is subjected to a photolithography process (S30) to pattern the banks 195 (S31).

Other Example of Method of Manufacturing Semiconductor Device 10

FIG. 2B illustrates another example of a method of manufacturing the semiconductor device 10. FIG. 2B is a flowchart illustrating an example of steps S41 to S71 of a process for manufacturing the semiconductor device 10. S41 to S51, S53 to S61, and S63 to S71 are the same processes as S1 to S11, S13 to S21, and S23 to S31, and thus descriptions thereof will be omitted.

In the flowchart of FIG. 2B, S52 and S62 may be understood as processes replacing the processes of S12 and S22, respectively, in the flowchart of FIG. 2A. Only S52 and S62 will be described hereinafter.

S52 differs from the above-described S12 in that the first gate insulating layer 14 is patterned in addition to the first flattened layer 15. For example, the first gate insulating layer 14 may be dry-etched at the same time as the first flattened layer 15 is dry-etched. Doing so ensures the circumferential ends of the contact hole 14HL formed in the first gate insulating layer 14 and the contact hole 15HL formed in the first flattened layer 15 coincide.

The first gate insulating layer 14 is patterned in S52, and thus in S62, only the passivation layer 17 and the second gate insulating layer 16 are patterned, without the first gate insulating layer 14 being formed. S62 differs from the above-described S22 in this respect. Thus, the timing at which the first gate insulating layer 14 is formed is not limited to that indicated in FIG. 2A.

Pixel Circuit 52

The configuration of the pixel circuit 52, which is provided in a display region (active area) of the display device 1, will be described with reference to FIG. 3. FIG. 3 is a circuit diagram illustrating the configuration of the pixel circuit 52 corresponding to an mth column and an nth row. Note that the configuration of the pixel circuit 52 described here is merely one example, and another known configuration can be employed instead.

The pixel circuit 52 illustrated in FIG. 3 includes one light emitting element 170, six transistors T1 to T6 (a driving transistor T1, a write control transistor T2, a power supply control transistor T3, a light emission control transistor T4, a threshold voltage compensation transistor T5, and an initialization transistor T6), and one capacitor C1. The capacitor C1 is a capacitance element constituted by two electrodes.

In FIG. 3, S(m) indicates a data line S in the mth column. G(n) and EM(n) indicate a scanning signal line G and a light emission control line EM, respectively, in the nth row. A plurality of the data lines, and a plurality of the scanning signal lines G(n) orthogonal to the data lines, are arranged in the display region.

A plurality of the light emission control lines are arranged in the display region corresponding one-to-one with the plurality of scanning signal lines. Furthermore, the pixel circuits 52 are provided corresponding to the points in the display region where the plurality of data lines and the plurality of scanning signal lines intersect. A matrix of a plurality of pixels is formed in the display region by providing the pixel circuits 52 in this manner.

Power source lines (not illustrated) common to the pixel circuits 52 are arranged in the display region. To be more specific, a power source line allowing a high-level power source voltage ELVDD for driving the light emitting elements 170 to be supplied (high-level power source line), a power source line allowing a low-level power source voltage ELVSS for driving the organic EL elements to be supplied (low-level power source line), and a power source line allowing an initialization voltage Vini to be supplied (initialization power source line), are arranged. The high-level power source voltage ELVDD, the low-level power source voltage ELVSS, and the initialization voltage Vini are supplied from a power source circuit (not illustrated).

Noise in Semiconductor Device 10

Prior to describing the effects of the semiconductor device 10, noise in the semiconductor device 10 will be discussed. A comparatively high positive or negative voltage (gate voltage) (and more precisely, a voltage having a comparatively high absolute value) is applied to the gate electrode of a TFT to switch that TFT on/off (conductive/non-conductive).

For example, to turn an n-channel TFT on, a comparatively high positive gate voltage is applied to the gate electrode of the TFT. On the other hand, to turn a p-channel TFT on, a comparatively high negative gate voltage is applied to the gate electrode of the TFT.

Thus, in the semiconductor device 10, comparatively high gate voltages are applied to the gate electrode layer 145GA of the LTPS-TFT 10A and the gate electrode layer 145GB of the oxide semiconductor TFT 10B.

Additionally, in the LTPS-TFT 10A, capacitive coupling not intended by design arises between the gate electrode layer 145GA and other electrode layers (the source electrode layer 135SA in particular). Thus, in the case where a gate voltage is applied to the gate electrode layer 145GA, noise arises in the periphery of the gate electrode layer 145GA due to the capacitive coupling and the gate voltage.

The amount of noise depends on the degree of capacitive coupling (the electrostatic capacitance between the gate electrode layer and the source electrode layer) and the magnitude of the gate voltage. The noise becomes more pronounced as at least one of the electrostatic capacitance and the gate voltage increases.

As such, in the case where a gate voltage is applied to the gate electrode layer 145GA, noise may be superimposed on a signal applied to the source electrode layer 135SA, for example. Noise may also be superimposed on the gate voltage itself. There is thus the possibility that the actions of the LTPS-TFT 10A will become less reliable (e.g., switching cannot be carried out appropriately).

In the oxide semiconductor TFT 10B, too, capacitive coupling arises between the gate electrode layer 145GB and other electrode layers (the source electrode layer 165SB in particular). Thus, in the case where a gate voltage is applied to the gate electrode layer 145GB, noise arises in the periphery of the gate electrode layer 145GB due to the capacitive coupling and the gate voltage.

As such, in the case where a gate voltage is applied to the gate electrode layer 145GB, noise may be superimposed on a signal applied to the source electrode layer 165SB, for example. Noise may also be superimposed on the gate voltage itself.

A problem thus arises in that, for example, the desired voltage and current cannot be outputted to the drain electrode layer 165DB (i.e., the desired voltage and current cannot be supplied to the anode of the light emitting element 170). In other words, there is the possibility that the actions of the oxide semiconductor TFT 10B will become less reliable (e.g. the light emitting element 170 cannot be driven appropriately).

Effects of Semiconductor Device 10

The inventors of the present application (simply "inventors" hereinafter) arrived at the configuration of the semiconductor device 10 as a response to the drop in reliability of the actions of an LTPS device caused by noise as described above.

Specifically, the inventors arrived at the technical concept of separating the gate electrode layer and the source electrode layer enough to reduce the degree of capacitive coupling between the gate electrode layer and the source electrode layer (the electrostatic capacitance between the gate electrode layer and the source electrode layer) in each TFT.

On the basis of this technical concept, the inventors arrived at the specific configuration of separating the gate electrode layer and the source electrode layer by interposing the first flattened layer 15 (a layer formed from a SOG material) between the gate electrode layer and the source electrode layer in each TFT.

Thus, on the basis of this technical concept, the LTPS-TFT 10A includes the first gate insulating layer 14 provided between the gate electrode layer 145GA and the source electrode layer 135SA. Furthermore, the first flattened layer 15 is provided upon the gate electrode layer 145GA. In other words, the LTPS-TFT 10A is formed with a region, where the first flattened layer 15 is interposed and presents between the gate electrode layer 145GA and the source electrode layer 135SA.

This makes it possible to reduce electrostatic capacitance between the gate electrode layer 145GA and the source electrode layer 135SA. As such, in the LTPS-TFT 10A, the above-described noise can be reduced, and thus the reliability of the LTPS-TFT 10A can be improved.

Likewise, the oxide semiconductor TFT 10B includes the first flattened layer 15 provided upon the gate electrode layer 145GB. In other words, the oxide semiconductor TFT 10B is formed with a region, where the first flattened layer 15 is interposed and presents between the gate electrode layer 145GB and the source electrode layer 165SB.

This makes it possible to reduce electrostatic capacitance between the gate electrode layer 145GB and the source electrode layer 165SB. As such, in the oxide semiconductor TFT 10B, noise can be reduced, and thus the reliability of the oxide semiconductor TFT 10B can be improved.

Incidentally, the oxide semiconductor layer 165SLB of the oxide semiconductor TFT 10B is, for example, formed from an InGaZnOx-based metal oxide. A comparatively high-temperature process is thus necessary to form the oxide semiconductor layer 165SLB. As such, in the case where a material having low thermal resistance is used as the material of the first flattened layer 15, the first flattened layer 15 may degrade during the high-temperature process for forming the oxide semiconductor layer 165SLB.

However, a SOG material is used as the material of the first flattened layer 15, as described above. A SOG material is a material having a high thermal resistance, and thus the first flattened layer 15 can be prevented from degrading even during the high-temperature process for forming the oxide semiconductor layer 165SLB.

In this manner, the inventors newly discovered that using a SOG material as the material of the first flattened layer 15 (a layer that is sufficiently thick and effective in separating the gate electrode layer and the source electrode layer) makes it possible to improve the reliability of actions of an LTPS device.

According to the semiconductor device 10, electrostatic capacitance between the gate electrode layer and the source electrode layer can be reduced, and thus noise can be reduced even in the case where a comparatively high voltage (gate voltage) is applied to the gate electrode layer 145GA and the gate electrode layer 145GB.

As such, a comparatively high voltage can be applied to the semiconductor device 10, and thus turning the LTPS-TFT 10A and the oxide semiconductor TFT 10B on/off using the gate voltage can be controlled more reliably.

Thus, according to the semiconductor device 10, the reliability of the actions of an LPTO device can be improved.

Examples of Connections of Layers in Oxide Semiconductor TFT 10B

Several examples of the connections of the layers in the oxide semiconductor TFT 10B will be described next with reference to FIGS. 4 to 8. Note that in FIGS. 3 to 7, for the sake of simplicity, some members (e.g., the banks 195) are not illustrated.

Figure 4:
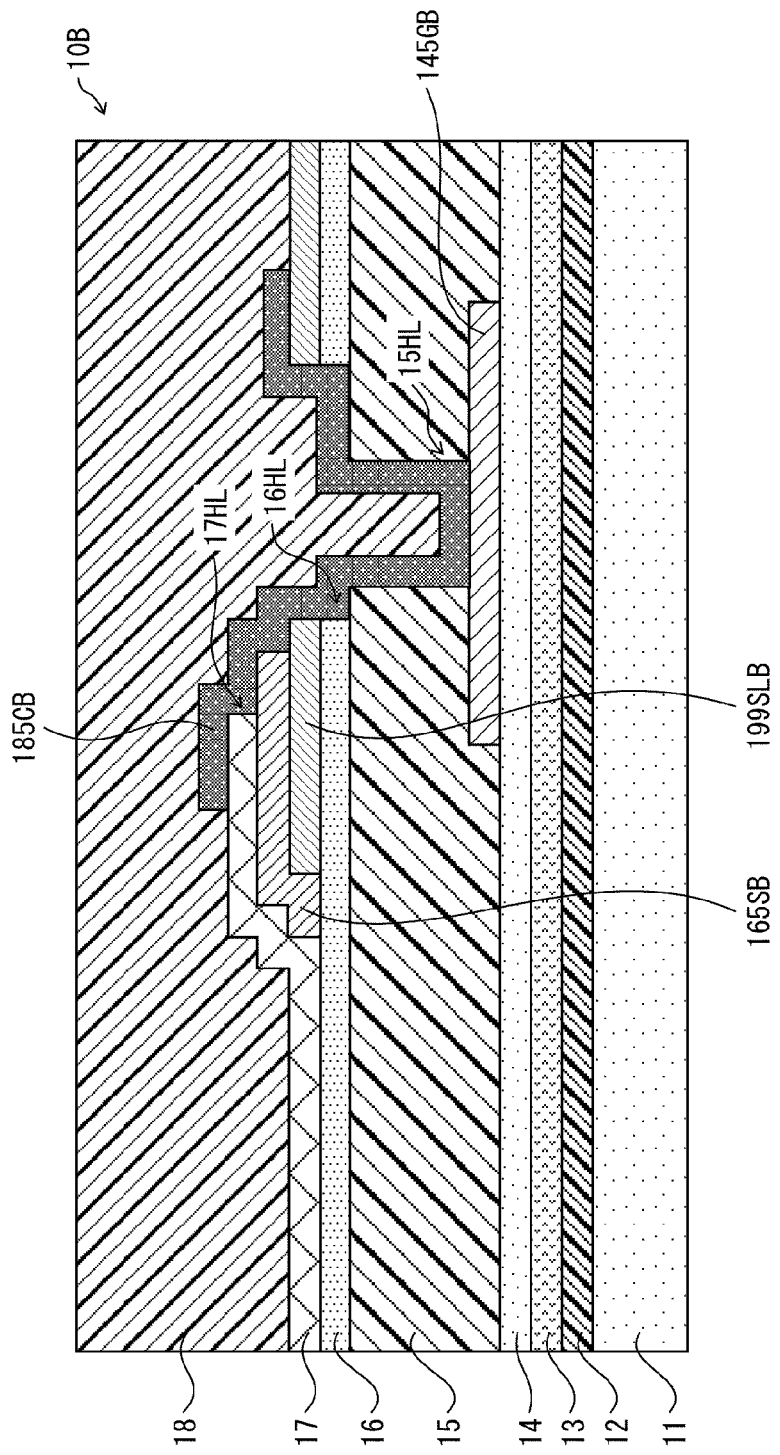
FIG. 4 is a diagram illustrating an example of connections among various layers in the oxide semiconductor TFT illustrated in FIG. 1B.

(1) FIG. 4 illustrates an example of electrical connections between the gate electrode layer 145GB (first metal layer) and the layers in which the source electrode layer 165SB is provided (second metal layer), in the oxide semiconductor TFT 10B.

An oxide semiconductor layer 199SLB illustrated in FIG. 4 and the subsequent drawings is an etching stopper used in the case where the contact holes provided in the first flattened layer 15, the inorganic layer 13, and the like are etched. The oxide semiconductor layer 199SLB may be formed from the same material as that of the oxide semiconductor layer 165SLB.

As illustrated in FIG. 4, an electrode layer 185CB (third metal layer) is provided in the oxide semiconductor TFT 10B. The contact hole 15HL is formed exposing the gate electrode layer 145GB. Furthermore, the source electrode layer 165SB (second metal layer) and the oxide semiconductor layer 199SLB (etching stopper) are partially exposed in the contact hole 17HL.

Circumferential ends of the oxide semiconductor layer 199SLB exposed in the contact hole 17HL coincide with the circumferential ends of the second gate insulating layer 16. In the case where the second gate insulating layer 16 is patterned, using the oxide semiconductor layer 199SLB as an etching stopper makes it possible to ensure the circumferential ends of the oxide semiconductor layer 199SLB and the second gate insulating layer 16 coincide.

"Coincide" means that the circumferential ends of two members (the oxide semiconductor layer 199SLB and the second gate insulating layer 16) are essentially flush as a result of the manufacturing method. The same applies to the other instances where the term "coincide" is used in the specification.

The electrode layer 185CB electrically connects the gate electrode layer 145GB and the source electrode layer 165SB with the contact holes (contact holes 17HL to 15HL) therebetween. To be more specific, the electrode layer 185CB electrically connects the gate electrode layer 145GB and the source electrode layer 165SB while covering the gate electrode layer 145GB exposed in the contact hole 15HL and the source electrode layer 165SB exposed in the contact hole 17HL.

According to the configuration illustrated in FIG. 4, the oxide semiconductor layer 199SLB (etching stopper) can prevent uneven recesses and protrusions from being formed in the contact holes in the case where the passivation layer 17, the second gate insulating layer 16, and the first gate insulating layer 14 are subjected to dry etching at the same time. The electrical connections made by the contact holes can be made more reliably as a result.

Figure 5:
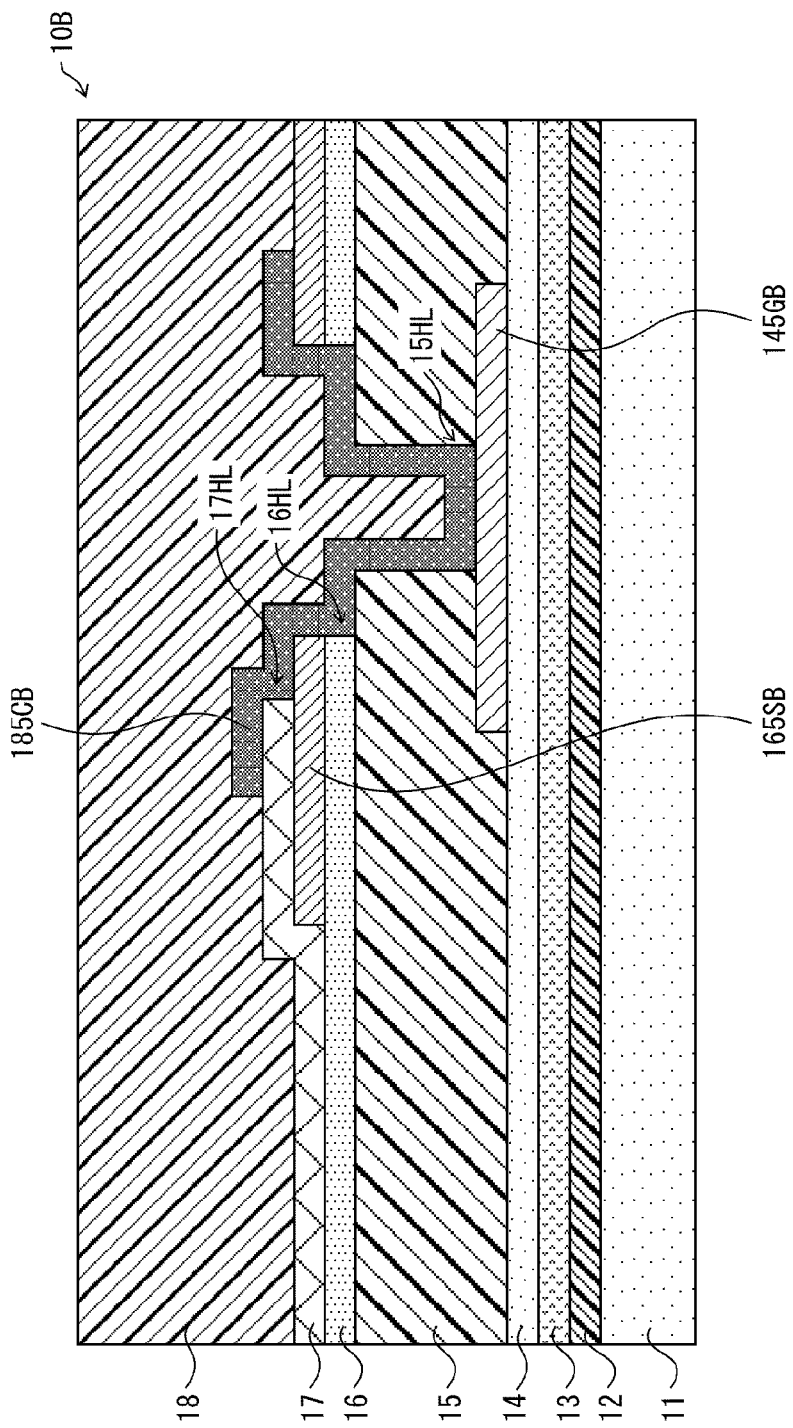
FIG. 5 is a diagram illustrating an example of connections among various layers in the oxide semiconductor TFT illustrated in FIG. 1B.

(2) FIG. 5 illustrates another example of electrical connections between the gate electrode layer 145GB (first metal layer) and the layers in which the source electrode layer 165SB is provided (second metal layer), in the oxide semiconductor TFT 10B. The configuration of FIG. 5 is achieved by omitting the oxide semiconductor layer 199SLB (etching stopper) from the configuration of FIG. 4.

In the case where the first gate insulating layer 14 and the first flattened layer 15 are subjected to dry etching at the same time, the configuration of FIG. 5 can be achieved by dry etching only the passivation layer 17 and the second gate insulating layer 16 when forming the above-described contact holes. Thus, many variations can be employed with respect to the connections between the first metal layer and the second metal layer.

Figure 6:
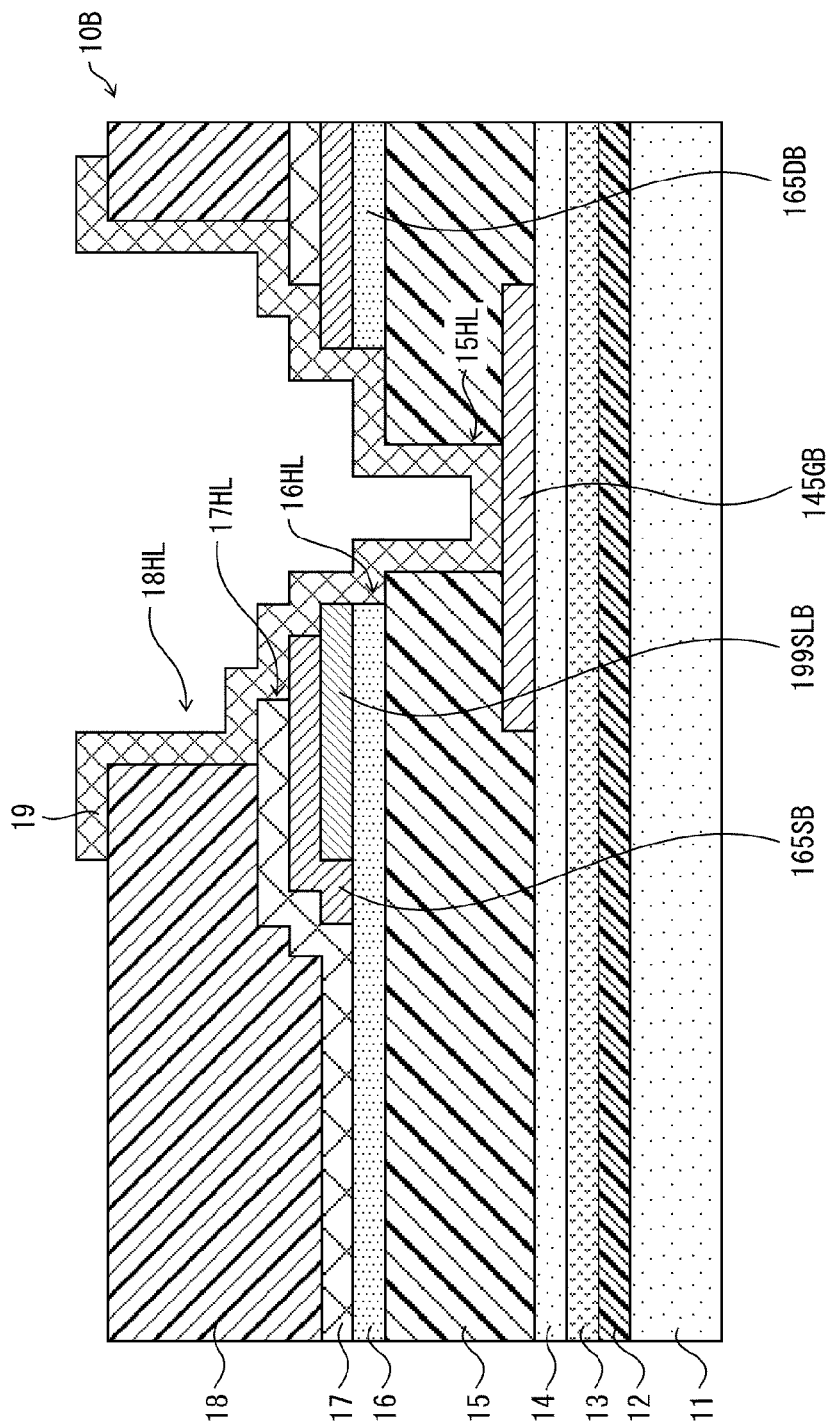
FIG. 6 is a diagram illustrating an example of connections among various layers in the oxide semiconductor TFT illustrated in FIG. 1B.

(3) FIG. 6 illustrates another example of electrical connections between the gate electrode layer 145GB (first metal layer) and the layers in which the source electrode layer 165SB is provided (second metal layer), in the oxide semiconductor TFT 10B.

In the example of FIG. 6, the above-described wiring line layer 19 (fourth metal layer) is used as a contact layer for connecting the gate electrode layer 145GB and the source electrode layer 165SB, instead of the electrode layer 185CB as in FIGS. 4 and 5. In the configuration of FIG. 6, the same material as that of the positive electrode of the light emitting element 170 (e.g., ITO or Ag) may be used as the material of the wiring line layer 19.

In the example of FIG. 6, a contact hole 18HL is provided in the second flattened layer 18. The opening in the contact hole 18HL is wider than the opening in the contact hole 17HL.

The wiring line layer 19 electrically connects the gate electrode layer 145GB and the source electrode layer 165SB with the contact holes (contact holes 18HL to 15HL) therebetween. To be more specific, the wiring line layer 19 electrically connects the gate electrode layer 145GB and the source electrode layer 165SB while covering the gate electrode layer 145GB exposed in the contact hole 15HL and the source electrode layer 165SB exposed in the contact hole 17HL. The wiring line layer 19 is formed so as to follow the faces of the respective members, from the face of the gate electrode layer 145GB toward the face of the second flattened layer 18.

Figure 7:
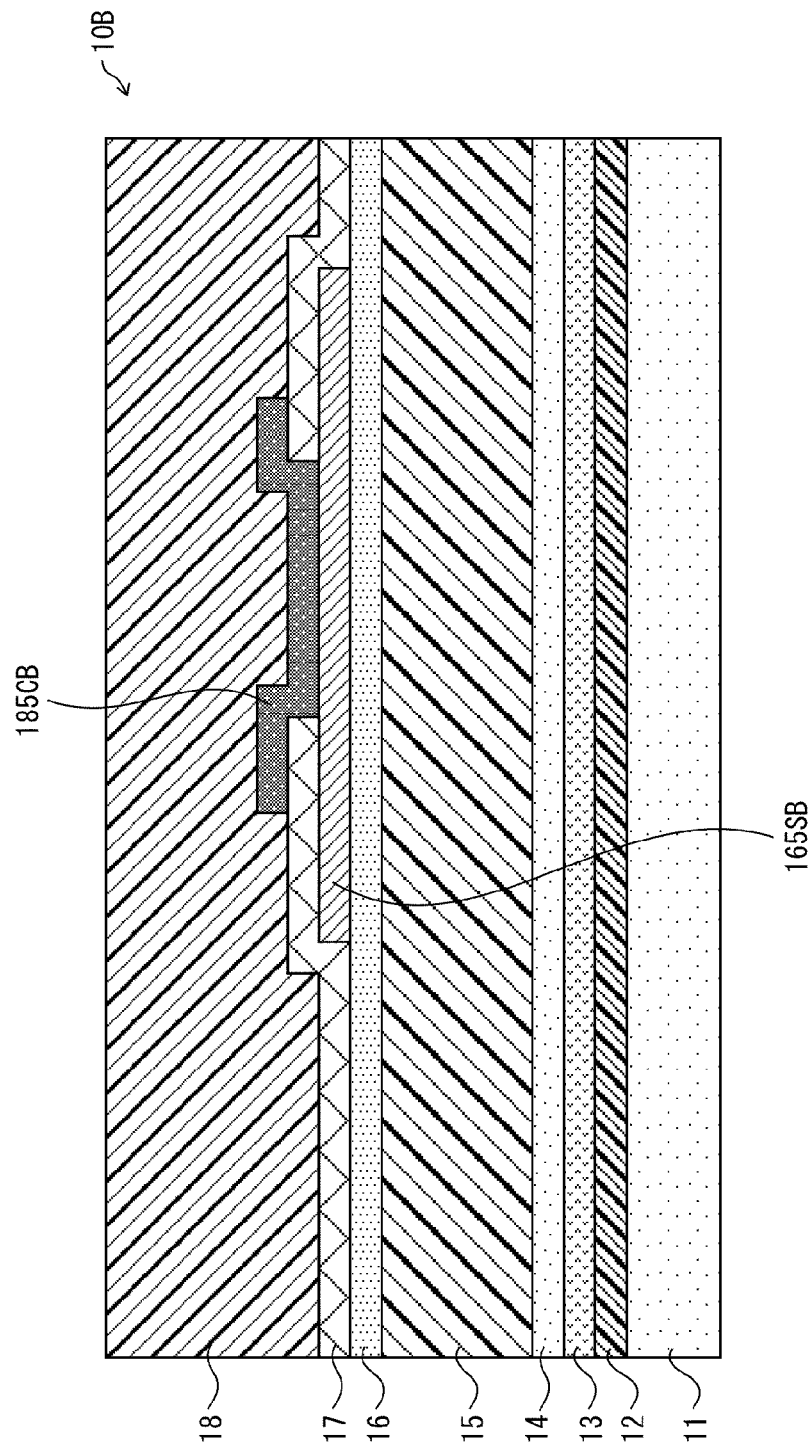
FIG. 7 is a diagram illustrating an example of connections among various layers in the oxide semiconductor TFT illustrated in FIG. 1B.

(4) FIG. 7 illustrates an example of electrical connections between the layers in which the source electrode layer 165SB is provided (second metal layer) and the electrode layer 185CB (third metal layer), in the oxide semiconductor TFT 10B.

As illustrated in FIG. 7, the electrode layer 185CB may be provided covering part of the source electrode layer 165SB.

Figure 8:
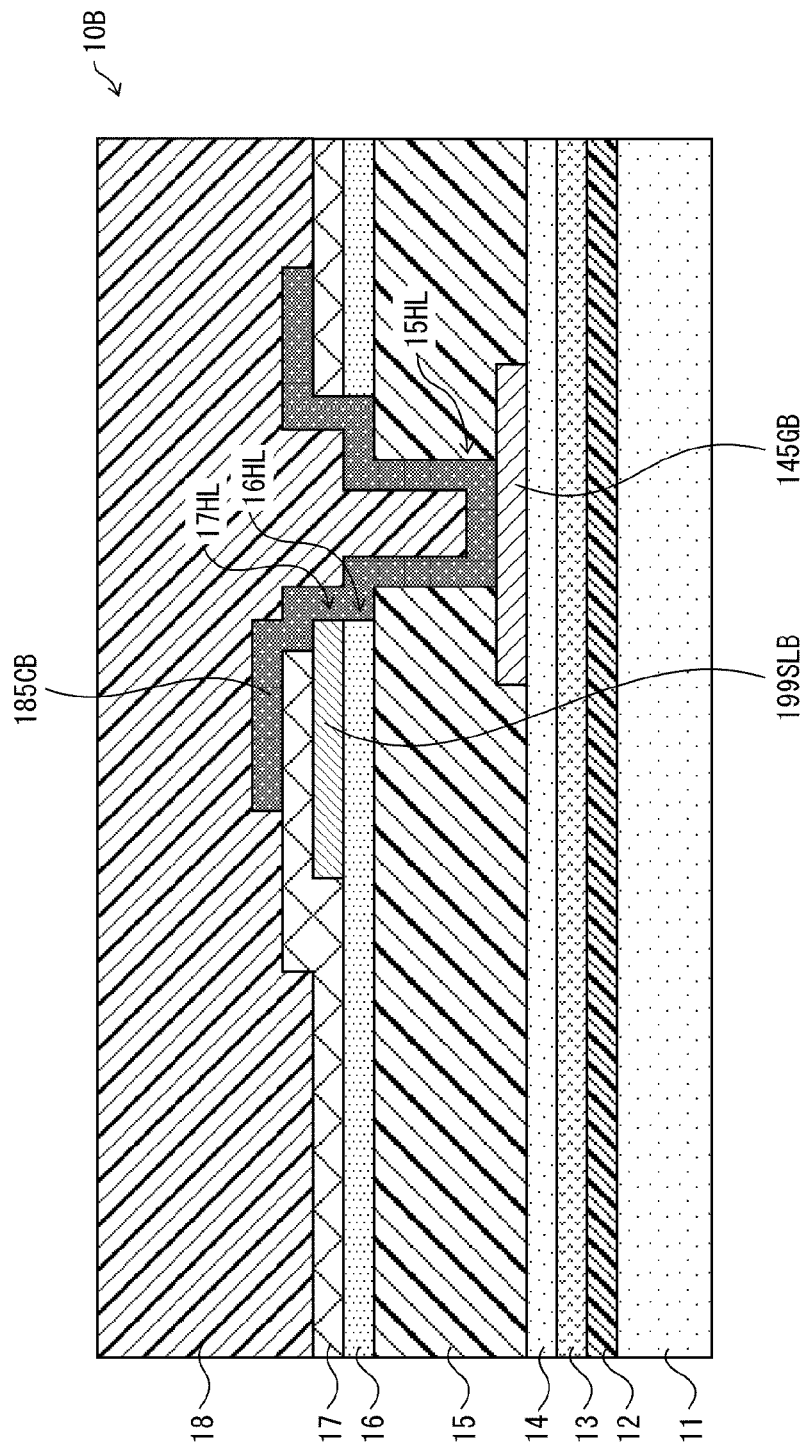
FIG. 8 is a diagram illustrating an example of connections among various layers in the oxide semiconductor TFT illustrated in FIG. 1B.

(5) FIG. 8 illustrates an example of electrical connections between the gate electrode layer 145GB (first metal layer) and the electrode layer 185CB (third metal layer) in the oxide semiconductor TFT 10B.

The electrode layer 185CB is formed in partially contact with the gate electrode layer 145GB and the oxide semiconductor layer 199SLB. The electrode layer 185CB is in contact with the semiconductor layer of the oxide semiconductor layer 199SLB (etching stopper) exposed in the contact hole 17HL. Note that the oxide semiconductor layer 199SLB (etching stopper) may be omitted from the configuration of FIG. 8.

The electrode layer 185CB covers the gate electrode layer 145GB exposed in the contact hole 15HL. Thus, the gate electrode layer 145GB and the electrode layer 185CB may be electrically connected as in the configuration of FIG. 8.

Second Embodiment

A second embodiment of the disclosure will be described hereinafter on the basis of FIG. 9. For the sake of simplicity, members having the same functions as the members described in the foregoing embodiment will be given the same reference signs, and descriptions thereof will be omitted.

The second embodiment describes a variation on the configuration of the oxide semiconductor TFT 10B of the first embodiment. An oxide semiconductor TFT of the second embodiment will be called an oxide semiconductor TFT 20B (second transistor) hereinafter.

Figure 9:
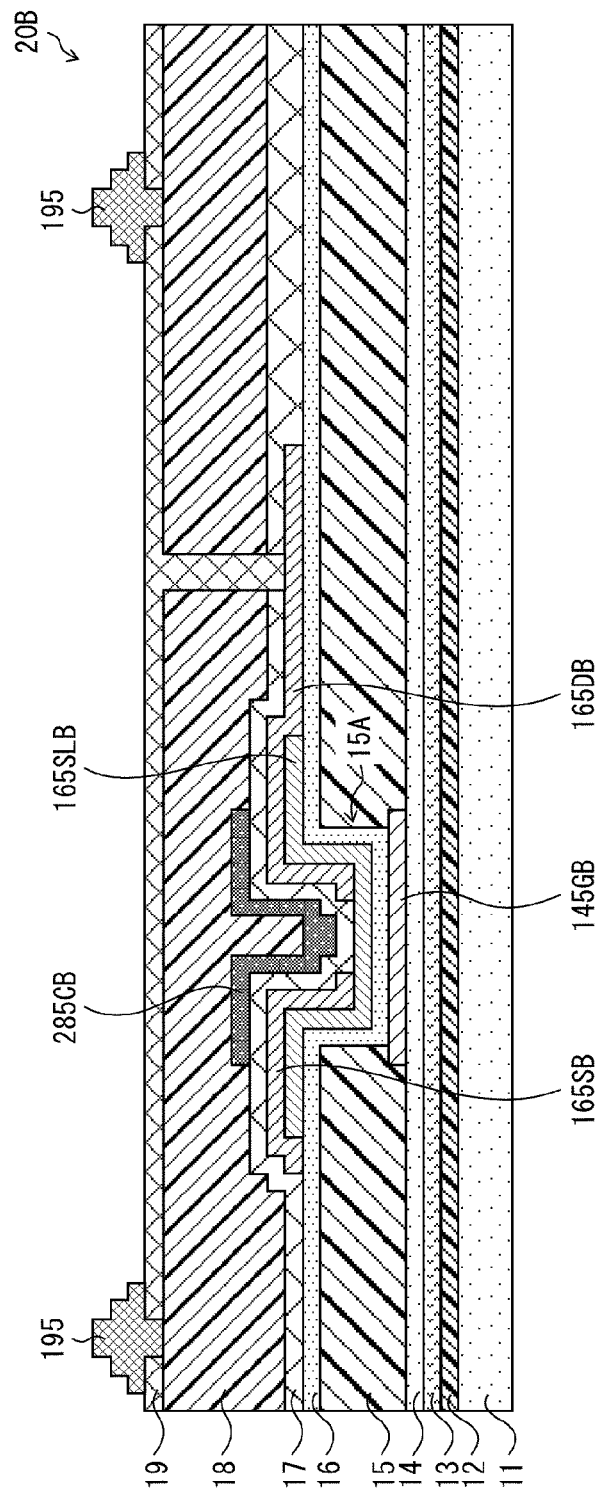
FIG. 9 is a diagram illustrating the overall configuration of an oxide semiconductor TFT in a semiconductor device according to a second embodiment.

FIG. 9 is a diagram illustrating the overall configuration of the oxide semiconductor TFT 20B. The oxide semiconductor TFT 20B has a configuration obtained by adding an electrode layer 285CB (third metal layer) to the oxide semiconductor TFT 10B of the first embodiment. The electrode layer 285CB is formed on parts of the face of the passivation layer 17.

Specifically, the electrode layer 285CB is disposed at least partially overlapping the oxide semiconductor layer 165SLB, the source electrode layer 165SB, and the drain electrode layer 165DB, when viewed from the normal direction of the electrode layer 285CB.

Accordingly, the electrode layer 285CB may be used as an additional gate electrode layer (second gate electrode) of the oxide semiconductor TFT 20B. Note that the gate electrode layer 145GB may also be referred to as a "first gate electrode" to distinguish it from the second gate electrode.

Thus, the oxide semiconductor TFT 20B includes the gate electrode layer 145GB (gate electrode formed by the first metal layer) and the electrode layer 285CB (gate electrode formed by the third metal layer) as two gate electrode layers. In other words, the oxide semiconductor TFT 20B is configured as a dual gate-type TFT.

As described above, the oxide semiconductor TFT 20B includes the gate electrode layer 145GB (first gate electrode layer) below the oxide semiconductor layer 165SLB and the electrode layer 285CB (second gate electrode layer) above the oxide semiconductor layer 165SLB. As such, the oxide semiconductor TFT 20B may be called a dual face gate-type TFT.

According to the oxide semiconductor TFT 20B, a gate voltage can be applied to the gate electrode layer 145GB (first gate electrode layer) and the electrode layer 285CB (second gate electrode layer). As such, the oxide semiconductor TFT 20B can be switched on/off more quickly. In other words, the response of the oxide semiconductor TFT 20B (e.g. a driving TFT) can be improved, and the light emitting element 170 can be driven faster.

Modified Example

Figure 10:
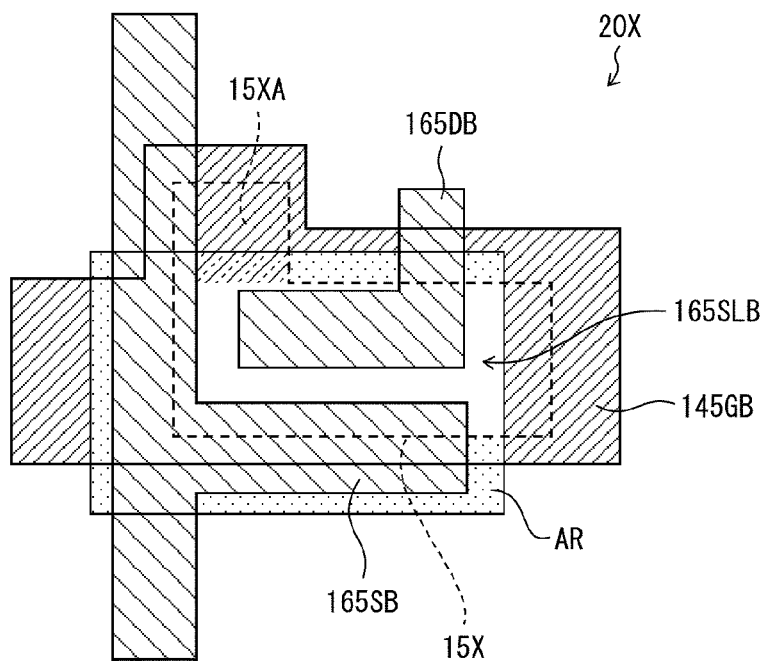
FIG. 10 is a diagram illustrating a comparative example for the semiconductor device according to the second embodiment.
Figure 11:
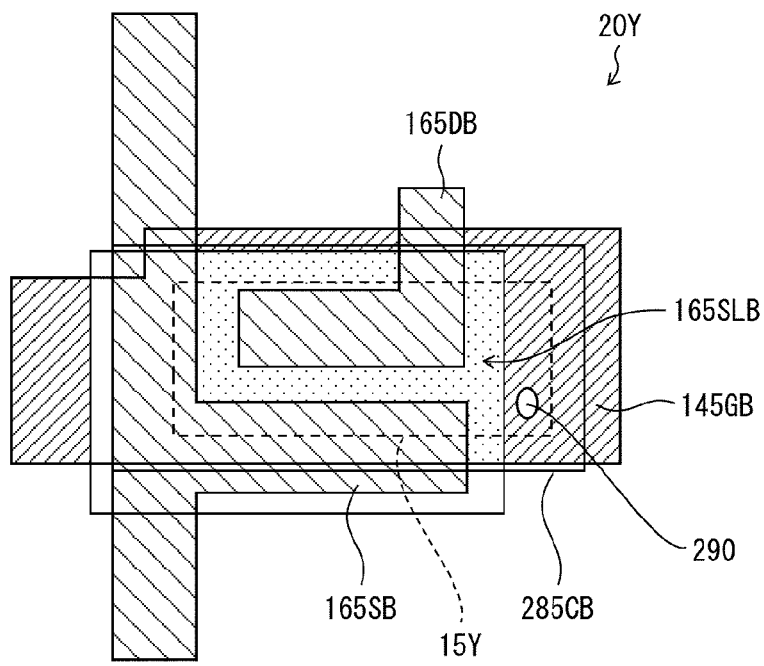
FIG. 11 is a diagram illustrating a modified example for the semiconductor device according to the second embodiment.

FIG. 10 is a top view illustrating a semiconductor device 20X as a comparative example for the second embodiment. FIG. 11 is a top view illustrating a semiconductor device 20Y as a modified example on the second embodiment.

As illustrated in FIG. 11, the semiconductor device 20Y includes an opening 15Y. The opening 15Y is an opening in the first flattened layer 15 that accommodates part of the second gate insulating layer 16. A contact hole 290 that electrically connects the gate electrode layer 145GB (first gate electrode layer) and the electrode layer 285CB (second gate electrode layer) is provided in the semiconductor device 20Y. The contact hole 290 is formed passing through each of the members separating the gate electrode layer 145GB and the electrode layer 285CB (the first flattened layer 15, the second gate insulating layer 16, and the passivation layer 17) in the opening 15Y.

According to the semiconductor device 20Y, the gate electrode layer 145GB can be set to the same potential as the electrode layer 285CB by the contact hole 290. Accordingly, setting the gate voltage of the electrode layer 285CB makes it possible to set the gate voltage of the gate electrode layer 145GB to be the same as the gate voltage of the electrode layer 285CB. In other words, setting the gate voltage of the electrode layer 285CB makes it possible to control the channel of the oxide semiconductor layer 165SLB turning on/off (conductive/non-conductive).

Thus, unlike the semiconductor device 20X, which will be described below, it is not necessary to provide a bulging portion 15XA. As such, according to the semiconductor device 20Y, the design of the gate electrode layer 145GB can be simplified and the semiconductor device 20Y can be made more compact.

Note that part of the oxide semiconductor layer 165SLB of the second transistor in the semiconductor device 20Y, the part being located above the first flattened layer 15, is located between the source electrode layer 165SB and the drain electrode layer 165DB so that the part is in contact with an end portion of the source electrode layer 165SB and an end portion of the drain electrode layer 165DB in the second transistor. The entirety of this part of the oxide semiconductor layer may overlap with the electrode layer 285CB, with the passivation layer 17 located therebetween.

No gate voltage is applied to the oxide semiconductor layer formed above the first flattened layer 15, and thus this layer is a cause of leak current. Thus, in the case where the electrode layer 285CB as illustrated in FIG. 11 is not provided, it is necessary for, of the oxide semiconductor layer 165SLB formed above the first flattened layer 15, the oxide semiconductor layer formed between the source electrode layer 165SB and the drain electrode layer 165DB not to be contiguous. In FIG. 10, an opening 15X is formed so that this oxide semiconductor layer is not contiguous.

On the other hand, according to the configuration of FIG. 11, even in a case where the above-described oxide semiconductor layer is contiguous, that semiconductor layer may be formed overlapping the electrode layer 285CB with the passivation layer 17 located therebetween. Doing so makes the opening 15X of FIG. 10 unnecessary. This makes it easy to design the opening, and is advantageous in terms of increasing the resolution of the display device.

Third Embodiment

A third embodiment of the disclosure will be described hereinafter on the basis of FIG. 12. The third embodiment describes a variation on the configuration of the LTPS-TFT 10A (switching TFT) of the first embodiment. For the sake of simplicity, the LTPS-TFT according to the third embodiment will be called an LTPS-TFT 30A (first transistor).

Figure 12:
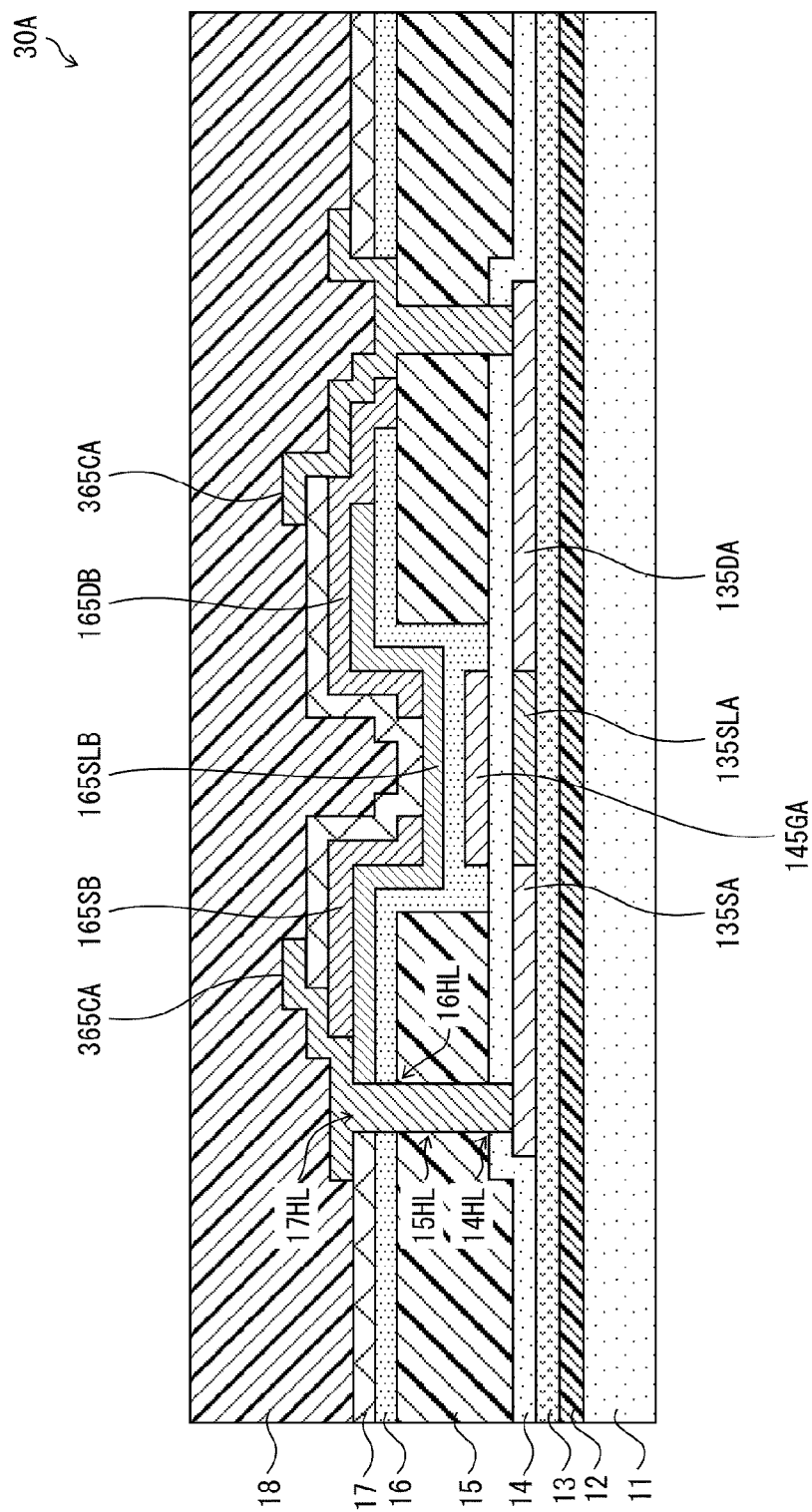
FIG. 12 is a diagram illustrating the overall configuration of an LTPS-TFT in a semiconductor device according to a third embodiment.

FIG. 12 is a diagram illustrating the overall configuration of the LTPS-TFT 30A. As illustrated in FIG. 12, the LTPS-TFT 30A further includes the oxide semiconductor layer 165SLB (second semiconductor layer) as a semiconductor layer in addition to the LTPS layer 135SLA (first semiconductor layer).

In other words, the LTPS-TFT 30A is formed from two semiconductor materials (LTPS and an oxide semiconductor material). The LTPS-TFT 30A may be understood as a switching TFT formed by combining the configurations of the LTPS-TFT 10A and the oxide semiconductor TFT 10B of the first embodiment. In the LTPS-TFT 30A, the part corresponding to the LTPS-TFT 10A and the part corresponding to the oxide semiconductor TFT 10B are both n-channel TFTs (n-channel transistors).

The LTPS-TFT 30A has a configuration in which (i) the members of the oxide semiconductor TFT 10B, aside from the gate electrode layer 145GB, the wiring line layer 19, and the banks 195, have been added to the LTPS-TFT 10A, and (ii) the electrode layers 165CA of the LTPS-TFT 10A have been replaced with electrode layers 365CA.

In the LTPS-TFT 30A, the gate electrode layer 145GA is used as a common gate electrode layer for the LTPS layer 135SLA and the oxide semiconductor layer 165SLB. The LTPS layer 135SLA is disposed below the gate electrode layer 145GA. The oxide semiconductor layer 165SLB is disposed above the gate electrode layer 145GA.

Like the electrode layers 165CA, the electrode layers 365CA are connected to the source electrode layer 135SA and the drain electrode layer 135DA with the contact holes 14HL to 17HL (and more specifically, wiring lines formed in the contact holes) therebetween.

The source electrode layer 135SA (the source electrode layer of the LTPS-TFT 10A) is electrically connected to the source electrode layer 165SB (the source electrode of the oxide semiconductor TFT 10B) with the electrode layers 365CA therebetween. Likewise, the drain electrode layer 135DA (the drain electrode of the LTPS-TFT 10A) is electrically connected to the drain electrode layer 165DB (the drain electrode layer of the oxide semiconductor TFT 10B) with the electrode layers 365CA therebetween.

The LTPS-TFT 30A is a TFT that further includes an oxide semiconductor material as a semiconductor material (further includes the oxide semiconductor layer 165SLB as a semiconductor layer). Thus, the LTPS-TFT 30A withstands current better than the LTPS-TFT 10A of the first embodiment.

As such, more current can flow through the LTPS-TFT 30A, and thus the reliability of the switching TFT can be improved.

Supplement

A semiconductor device according to a first aspect is a semiconductor device provided in a pixel circuit of a display device. The semiconductor device includes, in order from a lower side: a substrate; a semiconductor layer of a first transistor; a first insulating layer; a first metal layer; a first flattened layer; a second insulating layer; a semiconductor layer of a second transistor; a second metal layer; a third insulating layer; and a third metal layer. The first transistor includes low-temperature polysilicon as a semiconductor material; the second transistor includes an oxide semiconductor as a semiconductor material; and a gate electrode of the first transistor and a gate electrode of the second transistor are formed by the first metal layer.

According to a second aspect, the first insulating layer, the second insulating layer, and the third insulating layer are formed from an inorganic material, and the first flattened layer is formed from a Spin on Glass (SOG) material.

According to a third aspect, a source electrode and a drain electrode of the first transistor are electrically connected to the third metal layer with a contact hole formed in the first insulating layer, a contact hole formed in the first flattened layer, a contact hole formed in the second insulating layer, and a contact hole formed in the third insulating layer located between the source electrode and the drain electrode and the third metal layer.

According to a fourth aspect, when viewed from a direction perpendicular to the substrate, circumferential ends of the contact hole formed in the first insulating layer and the contact hole formed in the first flattened layer coincide; circumferential ends of the contact hole formed in the second insulating layer and the contact hole formed in the third insulating layer coincide; and an opening of the contact hole formed in the first insulating layer is narrower than an opening of the contact hole formed in the second insulating layer.

According to a fifth aspect, the second transistor includes an opening provided in the first flattened layer; the opening exposes the first metal layer to the greatest extent possible; the first metal layer exposed by the opening is covered by the second insulating layer; and the semiconductor layer of the second transistor and the second metal layer are formed in part of the opening.

According to a sixth aspect, at least part of the second transistor is a driving transistor configured to drive a light emitting element provided in the pixel circuit.

According to a seventh aspect, the semiconductor device further includes: a contact hole in the first flattened layer, the contact hole exposing the first metal layer; a contact hole in the second insulating layer; and a contact hole in the third insulating layer. The second metal layer and the semiconductor layer of the second transistor are partially exposed in the contact hole in the third insulating layer; a circumferential end of the semiconductor layer of the second transistor exposed in the contact hole in the third insulating layer coincides with a circumferential end in the second insulating layer; and the third metal layer electrically connects the first metal layer and the second metal layer while covering the first metal layer exposed in the contact hole in the first flattened layer and the second metal layer exposed in the contact hole in the third insulating layer.

According to an eighth aspect, the semiconductor device includes a second flattened layer and a fourth metal layer on the third metal layer in that order, and further includes: a contact hole in the first flattened layer, the contact hole exposing the first metal layer; a contact hole in the second insulating layer; a contact hole in the third insulating layer; and a contact hole in the second flattened layer. An opening of the contact hole in the second flattened layer is wider than an opening of the contact hole in the third insulating layer; the second metal layer and the semiconductor layer of the second transistor are partially exposed in the contact hole in the third insulating layer; a circumferential end of the semiconductor layer of the second transistor exposed in the contact hole in the third insulating layer coincides with a circumferential end in the second insulating layer; and the fourth metal layer electrically connects the first metal layer and the second metal layer while covering the first metal layer exposed in the contact hole in the first flattened layer and the second metal layer exposed in the contact hole in the third insulating layer.

According to a ninth aspect, the semiconductor device further includes: a contact hole in the first flattened layer, the contact hole exposing the first metal layer; a contact hole in the second insulating layer; and a contact hole in the third insulating layer. The semiconductor layer of the second transistor is partially exposed in the contact hole in the third insulating layer; a circumferential end of the semiconductor layer of the second transistor exposed in the contact hole in the third insulating layer coincides with a circumferential end in the second insulating layer; the third metal layer is in contact with the semiconductor layer of the second transistor exposed in the contact hole in the third insulating layer; and the third metal layer electrically connects to the first metal layer while covering the first metal layer exposed in the contact hole in the first flattened layer. The semiconductor device further includes: a contact hole in the first flattened layer, the contact hole exposing the first metal layer; a contact hole in the second insulating layer; and a contact hole in the third insulating layer. The semiconductor layer of the second transistor is partially exposed in the contact hole in the third insulating layer; a circumferential end of the semiconductor layer of the second transistor exposed in the contact hole in the third insulating layer coincides with a circumferential end in the second insulating layer; and the third metal layer is in contact with the semiconductor layer of the second transistor exposed in the contact hole in the third insulating layer, and covers the first metal layer exposed in the contact hole in the first flattened layer.

According to a tenth aspect, the second transistor further includes a second gate electrode formed by the third metal layer.

According to an eleventh aspect, of the semiconductor layer of the second transistor, the semiconductor layer being located above the first flattened layer, all of the semiconductor layer located between a source electrode and a drain electrode of the second transistor overlaps with the second gate electrode, with the third insulating layer located between the semiconductor layer and the second gate electrode, and the semiconductor layer is contact with an end portion of the source electrode of the second transistor and an end portion of the drain electrode of the second transistor.

According to a twelfth aspect, the gate electrode of the first transistor and the gate electrode of the second transistor are the same; the source electrode of the first transistor is electrically connected to the source electrode of the second transistor; and a drain electrode of the first transistor is electrically connected to a drain electrode of the second transistor.

A method of manufacturing a semiconductor device according to a thirteenth aspect is a method of manufacturing a semiconductor device provided in a pixel circuit of a display device, the semiconductor device including, in order from a lower side: a substrate; a semiconductor layer of a first transistor; a first insulating layer; a first metal layer; a first flattened layer; a second insulating layer; a semiconductor layer of a second transistor; a second metal layer; a third insulating layer; and a third metal layer. The first transistor includes low-temperature polysilicon as a semiconductor material; and the second transistor includes an oxide semiconductor as a semiconductor material. The method includes forming a gate electrode of the first transistor and a gate electrode of the second transistor by the first metal layer.

According to a fourteenth aspect, the method of manufacturing a semiconductor device further includes: forming the first insulating layer, the second insulating layer, and the third insulating layer from an inorganic material; and forming the first flattened layer from a Spin on Glass (SOG) material.

According to a fifteenth aspect, the method of manufacturing a semiconductor device further includes: forming a contact hole in the first insulating layer, a contact hole in the first flattened layer, a contact hole in the second insulating layer, and a contact hole in the third insulating layer; and electrically connecting a source electrode and a drain electrode of the first transistor to the third metal layer with the contact holes located between the source electrode and the drain electrode and the third metal layer.

According to a sixteenth aspect, the method of manufacturing a semiconductor device further includes, in the second transistor, forming an opening in the first flattened layer to expose the first metal layer to the greatest extent possible; covering the first metal layer exposed in the opening with the second insulating layer; and forming the semiconductor layer of the second transistor and the second metal layer in part of the opening.

According to a seventeenth aspect, the method of manufacturing a semiconductor device further includes: forming a contact hole in the first flattened layer to expose the first metal layer; forming a contact hole in the second insulating layer; and forming a contact hole in the third insulating layer to partially expose the second metal layer and the semiconductor layer of the second transistor. A circumferential end of the semiconductor layer of the second transistor exposed in the contact hole in the third insulating layer coincides with a circumferential end in the second insulating layer. The method further includes electrically connecting the first metal layer and the second metal layer by the third metal layer covering the first metal layer exposed in the contact hole in the first flattened layer and the second metal layer exposed in the contact hole in the third insulating layer.

According to an eighteenth aspect, the semiconductor device includes a second flattened layer and a fourth metal layer on the third metal layer in that order, and the method further includes: forming a contact hole in the first flattened layer to expose the first metal layer; forming a contact hole in the second insulating layer; and forming a contact hole in the third insulating layer to partially expose the second metal layer and the semiconductor layer of the second transistor. An opening of the contact hole in the second flattened layer is wider than an opening of the contact hole in the third insulating layer, a circumferential end of the semiconductor layer of the second transistor exposed in the contact hole in the third insulating layer coincides with a circumferential end in the second insulating layer, and the method further includes electrically connecting the first metal layer and the second metal layer by the third metal layer covering the first metal layer exposed in the contact hole in the first flattened layer and the second metal layer exposed in the contact hole in the third insulating layer.

According to a nineteenth aspect, the method of manufacturing a semiconductor device further includes: forming a contact hole in the first flattened layer to expose the first metal layer; forming a contact hole in the second insulating layer; and forming a contact hole in the third insulating layer to partially expose the semiconductor layer of the second transistor in the contact hole of the third insulating layer. A circumferential end of the semiconductor layer of the second transistor exposed in the contact hole in the third insulating layer coincides with a circumferential end in the second insulating layer, and the method further includes electrically connecting the third metal layer and the first metal layer by covering the first metal layer exposed in the contact hole of the first flattened layer so that the third metal layer is in contact with the semiconductor layer of the second transistor exposed in the contact hole of the third insulating layer.

According to a twentieth aspect, the method of manufacturing a semiconductor device further includes providing, in the second transistor, a third metal layer that forms a second gate electrode.

According to a twenty-first aspect, in the semiconductor device, the gate electrode of the first transistor and the gate electrode of the second transistor are the same, and the method further includes: electrically connecting the source electrode of the first transistor to the source electrode of the second transistor; and electrically connecting a drain electrode of the first transistor to a drain electrode of the second transistor.

Additional Items

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features can be formed by combining the technical approaches disclosed in each of the embodiments.

REFERENCE SIGNS LIST

1 Display device
10, 20Y Semiconductor device
10A, 30A LTPS-TFT (first transistor)
10B, 20B Oxide semiconductor TFT (second transistor)
11 Substrate
14 First gate insulating layer (first insulating layer)
15 First flattened layer
15A, 15Y Opening
16 Second gate insulating layer (second insulating layer)
17 Passivation layer (third insulating layer)
18 Second flattened layer
19 Wiring line layer (fourth metal layer)
52 Pixel circuit
135SLA LTPS layer (semiconductor layer of first transistor)
135SA Source electrode layer (source electrode of first TFT)
135DA Drain electrode layer (drain electrode of first TFT)
145GA Gate electrode layer (gate electrode of first TFT, first gate electrode, first metal layer)
145GB Gate electrode layer (gate electrode of second TFT, first metal layer)
165SB Source electrode layer (source electrode of second TFT, second metal layer)
165DB Drain electrode layer (drain electrode of second TFT, second metal layer)
165CA Electrode layer (third metal layer)
165SLB Oxide semiconductor layer (semiconductor layer of second transistor)
185CB Electrode layer (third metal layer)
199SLB Oxide semiconductor layer (semiconductor layer of second transistor, etching stopper)
285CB Electrode layer (second gate electrode, third metal layer)
290 Contact hole
14HL Contact hole (contact hole in first insulating layer)
15HL Contact hole (contact hole in first flattened layer)
16HL Contact hole (contact hole in second insulating layer)
17HL Contact hole (contact hole in third insulating layer)
18HL Contact hole (contact hole in second flattened layer)

The invention claimed is:

1. A semiconductor device provided in a pixel circuit of a display device, the semiconductor device comprising, in order from a lower side:

a substrate;
a semiconductor layer of a first transistor;
a first insulating layer;
a first metal layer;
a single first flattened layer;
a second insulating layer;
a semiconductor layer of a second transistor;
a second metal layer;
a third insulating layer; and
a third metal layer, wherein
the first transistor includes low-temperature polysilicon as a semiconductor material,
the second transistor includes an oxide semiconductor as a semiconductor material,
a gate electrode of the first transistor and a gate electrode of the second transistor are defined by the first metal layer,
the first insulating layer, the second insulating layer, and the third insulating layer are made from an inorganic material,
the single first flattened layer consists of a Spin on Glass (SOG) material, and
in the second transistor:
  an opening is provided in the single first flattened layer, the opening exposes at least a portion of the first metal layer,
  the at least a portion of the first metal layer exposed by the opening is covered by the second insulating layer, and
  the semiconductor layer of the second transistor and the second metal layer are located in a portion of the opening, and
  the single first flattened layer directly contacts a top surface of the gate electrode of the second transistor.

2. The semiconductor device according to claim 1, wherein a source electrode and a drain electrode of the first transistor are electrically connected to the third metal layer through a contact hole in the first insulating layer, a contact hole in the single first flattened layer, a contact hole in the second insulating layer, and a contact hole in the third insulating layer located between the source electrode and the drain electrode and the third metal layer.

3. The semiconductor device according to claim 2, wherein when viewed from a direction perpendicular to the substrate:
  circumferential ends of the contact hole in the first insulating layer and the contact hole in the first flattened layer coincide,
  circumferential ends of the contact hole in the second insulating layer and the contact hole in the third insulating layer coincide,
  an opening of the contact hole in the first insulating layer is narrower than an opening of the contact hole in the second insulating layer, and
  a circumference of the contact hole is consistent throughout each of the first insulating layer, the single first flattened layer, the second insulating layer, and the third insulating layer.

4. The semiconductor device according to claim 1, wherein the second transistor is a driving transistor that drives a light emitting element provided in the pixel circuit.

5. The semiconductor device according to claim 1, wherein the second transistor further includes a second gate electrode including the third metal layer.

6. The semiconductor device according to claim 5, wherein of the semiconductor layer of the second transistor, the semiconductor layer is located above the single first flattened layer, all portions of the semiconductor layer located between a source electrode and a drain electrode of the second transistor overlap with the second gate electrode, with the third insulating layer being located between the semiconductor layer and the second gate electrode, and the semiconductor layer is in contact with an end portion of the source electrode of the second transistor and an end portion of the drain electrode of the second transistor.

7. The semiconductor device according to claim 1, wherein
  the gate electrode of the first transistor and the gate electrode of the second transistor are the same,
  a source electrode of the first transistor is electrically connected to a source electrode of the second transistor, and
  a drain electrode of the first transistor is electrically connected to a drain electrode of the second transistor.

* * * * *